US008824145B2

(12) United States Patent
Hosseini et al.

(10) Patent No.: US 8,824,145 B2
(45) Date of Patent: Sep. 2, 2014

(54) ELECTRIC DEVICE PACKAGE AND METHOD OF MAKING AN ELECTRIC DEVICE PACKAGE

(75) Inventors: Khalil Hosseini, Weihmichl (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 186 days.

(21) Appl. No.: 13/492,751

(22) Filed: Jun. 8, 2012

(65) Prior Publication Data

US 2013/0329365 A1 Dec. 12, 2013

(51) Int. Cl.
*H05K 7/20* (2006.01)

(52) U.S. Cl.
USPC ......... 361/699; 361/719; 165/80.4; 165/80.5; 165/104.19; 165/104.33; 257/713; 257/714

(58) Field of Classification Search
USPC ............... 361/679.46, 679.53, 698–700, 712, 361/717, 718, 722, 723; 165/80.4, 80.5, 165/104.19, 104.21, 104.26, 104.33; 29/825–858, 864; 257/714, 713, 739, 257/E23.097, E23.098, E23.051, E23.075, 257/E23.101; 438/107, 109, 122, 214, 280, 438/675
See application file for complete search history.

(56) References Cited

U.S. PATENT DOCUMENTS

| | | | |
|---|---|---|---|
| 3,668,506 A * | 6/1972 | Beasley et al. | 363/141 |
| 3,771,027 A * | 11/1973 | Marek | 257/166 |
| 4,178,630 A * | 12/1979 | Olsson | 363/141 |
| 5,199,165 A | 4/1993 | Crawford et al. | |
| 5,349,131 A * | 9/1994 | Sotani et al. | 174/24 |
| 6,085,831 A | 7/2000 | DiGiacomo et al. | |
| 6,133,631 A | 10/2000 | Belady | |
| 7,075,133 B1 * | 7/2006 | Padmanabhan et al. | 257/276 |
| 7,205,653 B2 * | 4/2007 | Brandenburg et al. | 257/714 |
| 7,338,840 B1 * | 3/2008 | Padmanabhan et al. | 438/122 |
| 7,400,502 B2 * | 7/2008 | Hamman | 361/699 |
| 7,482,272 B2 * | 1/2009 | Trezza | 438/675 |
| 7,485,957 B2 * | 2/2009 | Brandenburg et al. | 257/714 |
| 7,679,916 B2 * | 3/2010 | Orr et al. | 361/719 |
| 8,134,232 B2 * | 3/2012 | Lohr et al. | 257/720 |
| 2008/0171174 A1 | 7/2008 | Trezza | |

FOREIGN PATENT DOCUMENTS

JP 2004006603 A * 1/2004 .............. H01L 25/07

OTHER PUBLICATIONS

Heilmann, A., et al., "Clip Bonding on High-power Modules: Cleaning and Process Monitoring," Solid State Technology Insights for Electronics Manufacturing, http://www.electroiq.com/articles/ap/print/volume-16/issue-4/features/cover-story/clip-bonding-on-high-power-modules.html, downloaded on Apr. 18, 2012, pp. 1-6.
"Heatpipes No Chance for Hot Spots," Electronic AG MB—Heatpipes, pp. 1-4, May 13, 2011.
Nemec, P., et al., "Thermal Performance Measurement of Heat Pipe," Global Journal of Technology & Optimization, vol. 2, Transaction on Thermodynamic and Heat Transfer, Jun. 2011, pp. 1-7.
"Heatpipes for High Thermal Performance," http://www.knap.at/datenblaetter/pel/pel_dau_2-5.pdf, downloaded on Jun. 4, 2012, pp. 1-4.

* cited by examiner

*Primary Examiner* — Michail V Datskovskiy
(74) *Attorney, Agent, or Firm* — Slater & Matsil, L.L.P.

(57) ABSTRACT

A system and method for manufacturing an electric device package are disclosed. An embodiment comprises a carrier, a component disposed on the carrier, the component having a first component contact pad, and a first electrical connection between the first component contact pad and a first carrier contact pad, wherein the first electrical connection comprises a first hollow space, the first hollow space comprising a first liquid.

28 Claims, 6 Drawing Sheets

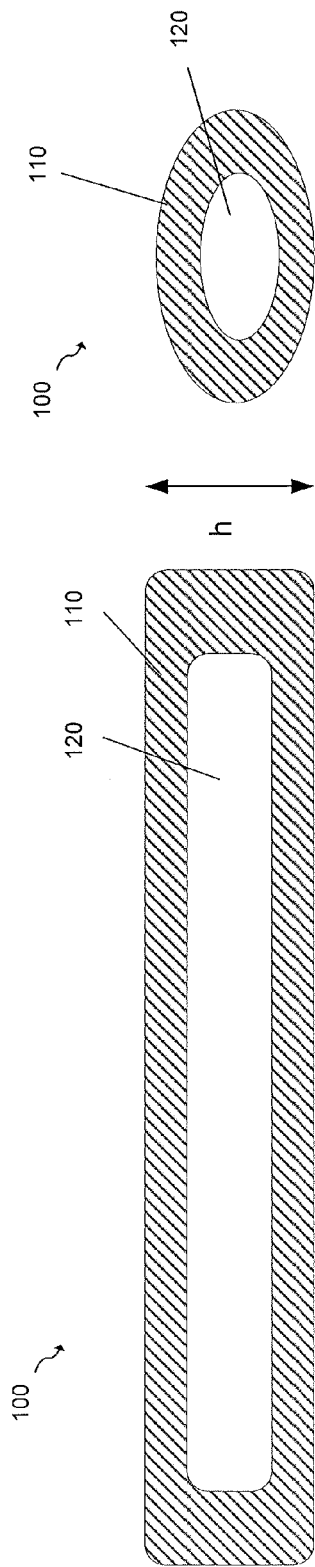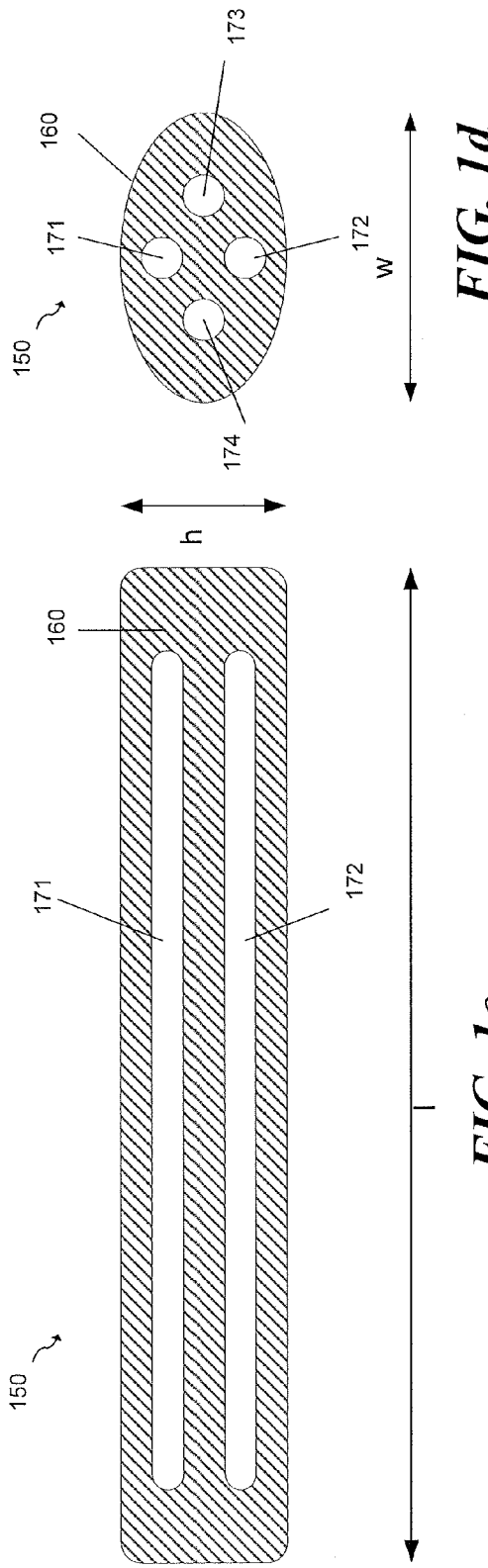

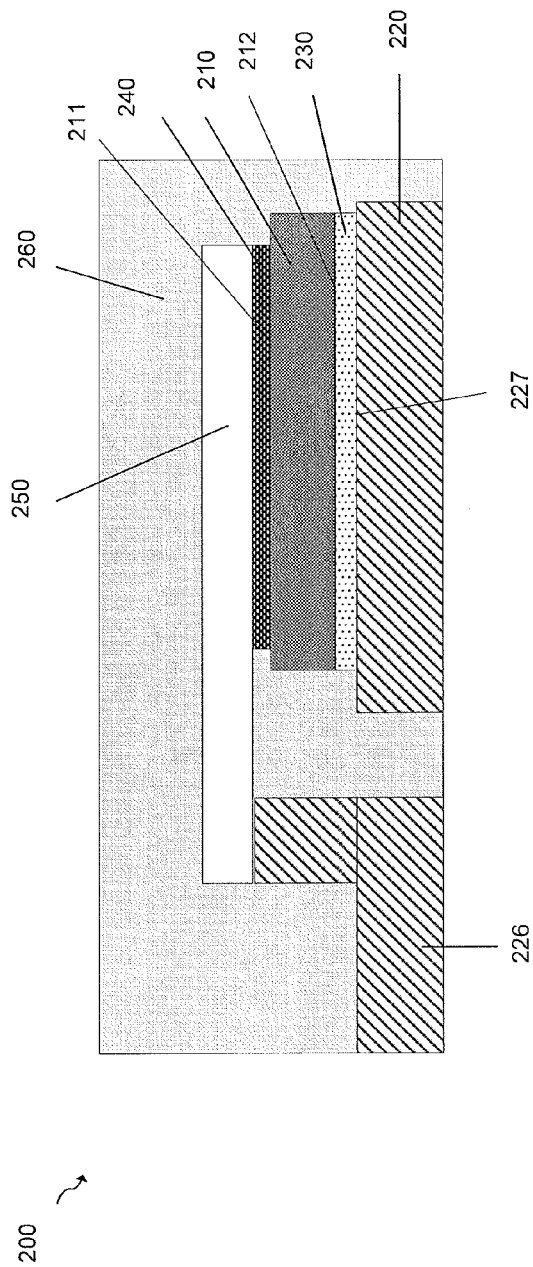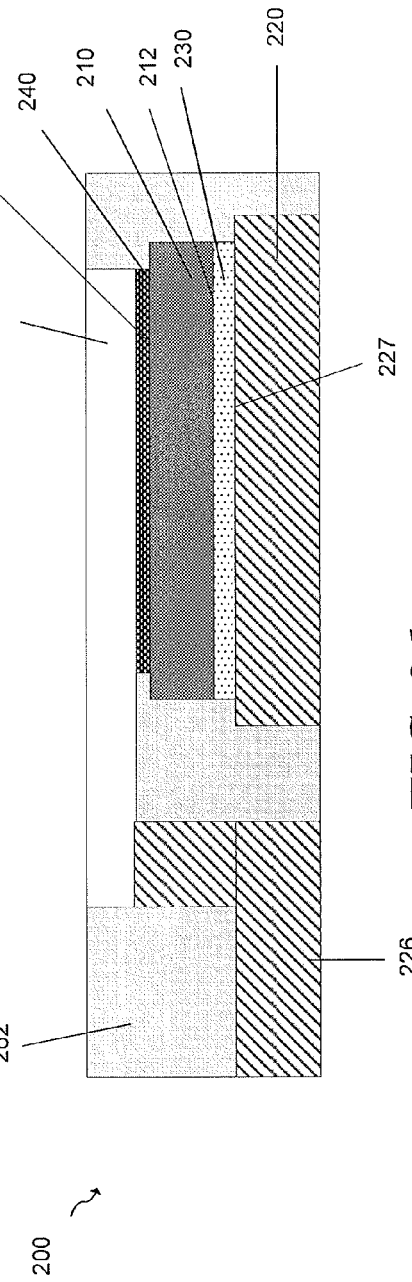

US 8,824,145 B2

ELECTRIC DEVICE PACKAGE AND METHOD OF MAKING AN ELECTRIC DEVICE PACKAGE

TECHNICAL FIELD

The present invention relates generally to a system and method for manufacturing an electric device package, and in particular embodiments, to a system and method for manufacturing a power semiconductor device package.

BACKGROUND

Power semiconductor devices are semiconductor devices used as switches or rectifiers in power electric circuits.

The realm of power devices is divided into two main categories: The two-terminal devices (diodes), whose state is completely dependent on the external power circuit they are connected to; and the three-terminal devices, whose state is not only dependent on their external power circuit, but also on the signal on their driving terminal (gate or base). Transistors and thyristors belong to that category.

A second classification is less obvious, but has a strong influence on device performance: Some devices are majority carrier devices such as Schottky diode and MOSFET, while the others are minority carrier devices such as Thyristor, bipolar transistor, and IGBT. The former use only one type of charge carriers, while the latter use both (i.e. electrons and holes). The majority carrier devices are faster, but the charge injection of minority carrier devices allows for better On-state performance.

SUMMARY OF THE INVENTION

In accordance with an embodiment of the present invention, an electric device package comprises a carrier, a component disposed on the carrier, the component having a first component contact pad, and a first electrical connection between the first component contact pad and a first carrier contact pad, wherein the first electrical connection comprises a first hollow space, the first hollow space comprising a first liquid.

In accordance with another embodiment of the present invention, an electric device package comprises a leadframe having a first lead and a second lead, a chip disposed on the leadframe, wherein the chip comprises a bottom surface and a top surface and wherein a first chip contact pad and a second chip contact pad are disposed on the top surface, and a first electrical connection electrically and thermally connecting the first chip contact pad and the first lead, wherein the first electrical connection encompasses a first liquid.

In accordance with a further embodiment of the present invention, a method of manufacturing an electric device package comprises placing a chip with a bottom surface on a carrier, the chip having a first and a second chip contact pads on a top surface and connecting the first chip contact pad and a first carrier contact pad with a first electrical connection, the first electrical connection comprising a fluid in a first hollow space.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a, 1c and 1e illustrate embodiments of conductive connection elements along a first direction;

FIGS. 1b and 1d illustrate embodiments of conductive connection elements along a second direction orthogonal to the first direction;

FIG. 2a-2d illustrate embodiments of packaged electric devices;

DETAILED DESCRIPTION OF ILLUSTRATIVE EMBODIMENTS

Figure 1E:
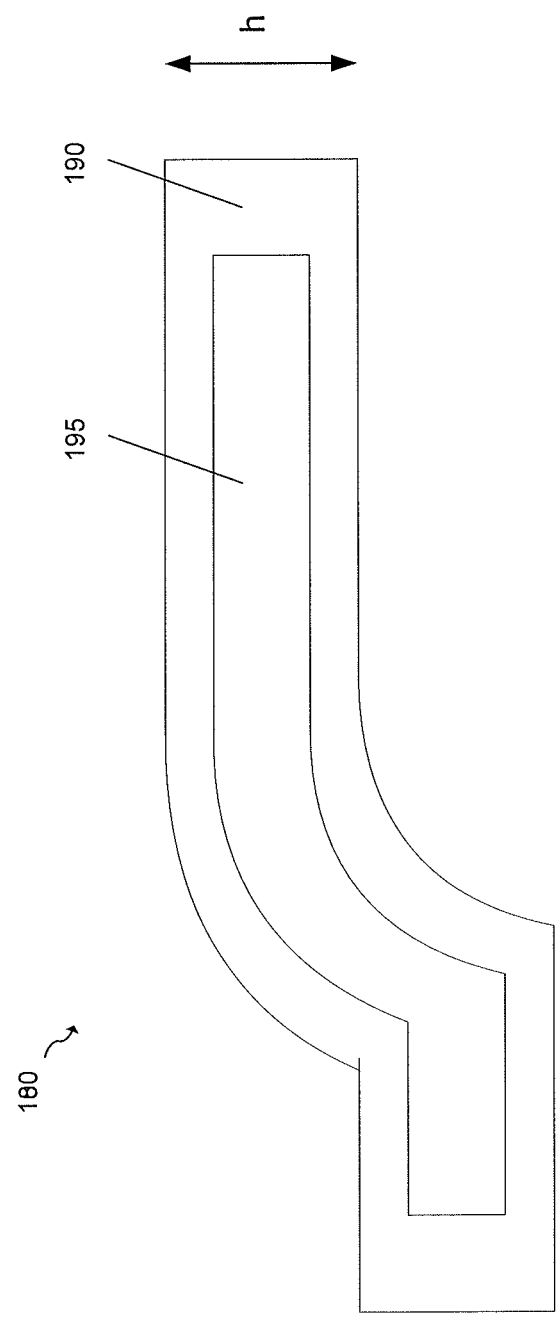
Figure 2A:
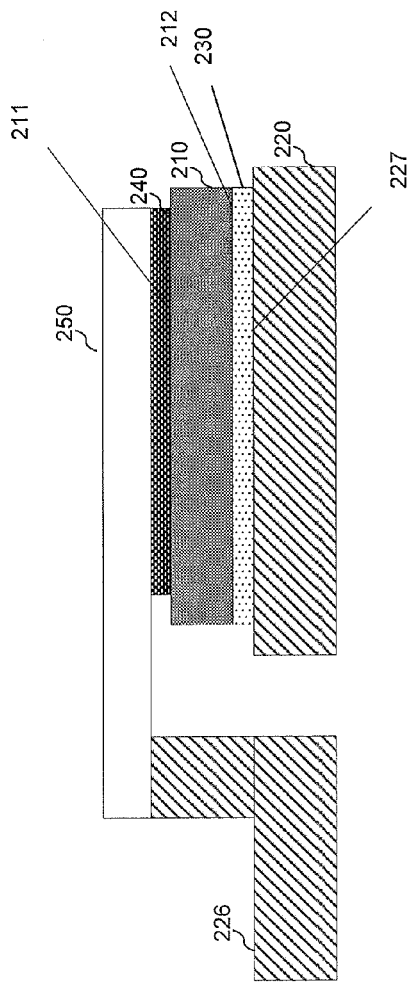
Figure 2B:
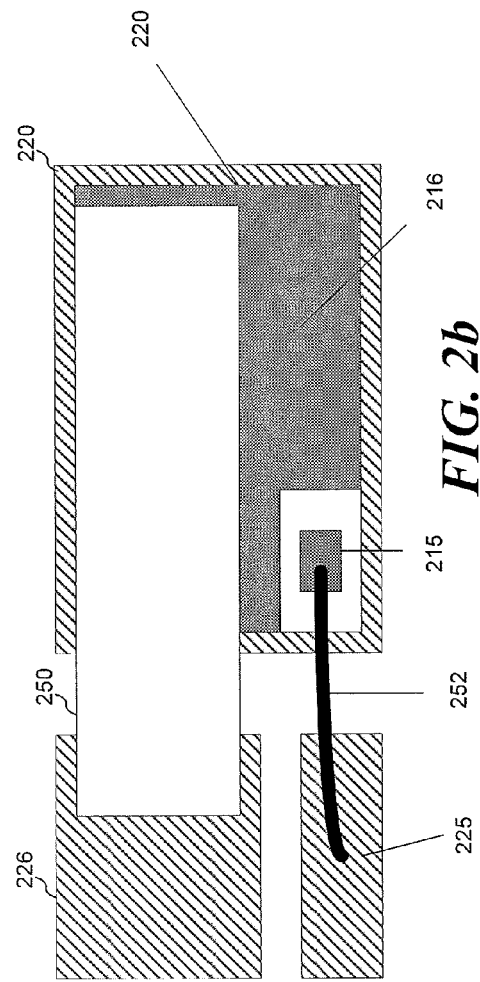

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a power semiconductor device package. The invention may also be applied, however, to other packages such as electric device packages.

A common problem of power semiconductor devices is heat dissipation. Power semiconductors generate a lot of heat due to large current conduction but do not perform well at elevated temperatures. Therefore the power semiconductor devices need to be cooled by removing the heat form the devices continuously.

In conventional packaged power semiconductor devices the heat is dissipated from the device through the chip bottom side and through a metal leadframe which transport the heat to the external environment.

An embodiment of the invention provides an electrical connection element configured to provide excellent electrical and thermal conductivity at the same time. The electrical connection element connects a component contact pad with a carrier contact pad to transport heat and current from the component. An embodiment of the invention provides a clip, a bridge, a tube, a body or a pipe between an electrical component and a carrier wherein the clip, the bridge, the tube, the body or the heat-pipe comprises a core or hollow space comprising liquid. In one embodiment the electrical connection element with the liquid filled hollow space is completely encapsulated. Alternatively, the electrical connection element is only partially encapsulated having a large exposed surface. An advantage of the clip, bridge, tube, body or pipe with liquid filled hollow space over the conventional electric connection element is that it provides up to 100 times better thermal conduction and therefore improves the cooling of the component.

FIGS. 1a and 1b show an embodiment of an electrical connection element or electrical connection 100. FIG. 1a is a cross sectional view along a first direction of the electrical connection element. The electrical connection element 100 may be a conductive clip, a conductive bridge, a conductive tube, a conductive body or a conductive pipe or heat-pipe. The electrical connection element 100 may comprise a conductive shell 110 and a core or hollow space 120 embedded therein. The hollow space 120 within the electrical connection element 100 may be completely encapsulated without access to the outside environment. In one embodiment, the hollow space 120 may comprise a capillary structure. For example, the hollow space 120 may comprise a porous capillary lining along the inner wall of the hollow space 120.

The hollow space 120 may be at least partially filled with a liquid. For example, the hollow space 120 is completely filled with liquid. In one embodiment the liquid 130 comprises or consists of alcohol, water ($H_2O$) or a combination thereof. Alternatively, the liquid comprises Toluene. The electrical connection element 100 may be a vacuum sealed closed pipe or tube. FIG. 1b shows a cross-sectional view of the electrical connection element 100 along a second direction, wherein the second direction is orthogonal to the first direction.

The electrical connection element 100 may comprise a metal. The metal may be copper or copper alloy, aluminum or aluminum alloy, nickel or nickel alloy, iron or iron alloy or combinations thereof. Alternatively, the electrical connection element 100 may comprise other conductive materials. The metal may envelop and seal completely the core 120. The height h of the electrical connection element 100 may be about 100 µm to about 400 µm, or about 200 µm to about 300 µm. The width w of the electrical connection element 100 may be about 1 mm to about 6 mm, or about 2 mm to about 4 mm. The length l of the electrical connection element 100 may be about 1 mm to about 10 mm, or about 3 mm to about 8 mm.

The electrical connection element 100 comprises excellent heat and electric conducting capabilities at the same time because it combines the electrical conductivity of a metal 110 with thermal conductivity, wherein the thermal conductivity is based on the thermal convection of the liquid in the core 120 of the electrical conducting element 100. For example, the liquid in the core 120 of the electrical connection element 100 is evaporated at the point where the electrical connection element 100 is in contact with a component contact pad (where the heat or high temperature is applied) and condenses along other portions of the electrical connection element 100 (where the temperature is lower). Of course, the heat may be applied to other portions of the electrical connection element 100. The electrical connection element 100 is an excellent heat conductor having a thermal conductivity that is up to 100 times better than the thermal conductivity of a pure metal electrical connection.

FIGS. 1c and 1d show another embodiment of an electrical connection element 150. FIG. 1c illustrates a cross sectional views along a first direction of the electrical connection element 150. The electrical connection element 150 may comprise the same or similar materials or dimensions as the electrical connection element 100. The electrical connection element 150 may be a clip, a tube, a body, a bridge or a pipe. The electrical connection element 150 comprises a conductive shell 160 and a plurality of spaces or hollow spaces 171, 172 therein.

The plurality of hollow spaces 171, 172 within the electrical connection element 150 may be completely encapsulated without access to the outside environment. The plurality of hollow spaces 170 may be at least partially filled with a liquid. Alternatively, some of the hollow spaces 170 may be at least partially filled with a liquid and others are not. FIG. 1d shows the electrical connection element 150 along a second direction (orthogonal to the first direction) with all four hollow spaces 171-174 (two of the hollow spaces 173 and 174 are not shown in FIG. 1c). In some embodiments the plurality of spaces 171-174 may be arranged in a different configuration. For example, short hollow spaces may be arranged after one another along the length l.

FIG. 1e shows yet another embodiment of an electrical connection element 180. FIG. 1e is a cross sectional view along a first direction. The electrical connection element 180 may comprise the same or similar materials, dimensions or configurations as the electrical connection elements 100 or 150. The electrical connection element 180 may comprise a conductive shell 190 and a core or hollow space 195 therein. The hollow space 195 may be at least partially filled with a liquid. The electrical connection element 180 is bent at one end of the connection element 180.

FIGS. 2a-2d show embodiments of a packaged electric device 200. The packaged electric device 200 may be a packaged power or high power semiconductor device. The following discussion focuses on packaged semiconductor devices. However, embodiments of the invention may also apply to other packaged devices.

The packaged electric device 200 comprises a component 210. The component 210 may include a chip (or die). The component 210 comprises a substrate. The substrate may be a semiconductor substrate such as silicon or germanium, or a compound substrate such as SiGe, GaAs, InP or SiC, or alternatively other materials. The semiconductor substrate may be a single crystal silicon or a silicon-on insulator (SOI). One or more interconnect metallization layers may be arranged on the substrate. A passivation layer is disposed on the top surface of the chip to electrical isolate the structured metal pads from each other. The passivation layer may comprise SiN, for example. The top surface of the component 210 is the first main surface 211. The bottom of the substrate is the second main surface 212 of the component 210. The component 210 may be a system on chip (SoC).

The chip 210 may comprise a discrete device such as a single semiconductor device or an integrated circuit (IC). For example, the chip 210 may comprise a power semiconductor device such as a bipolar transistor, an insulated gate bipolar transistor (IGBT), a power MOSFET, a thyristor or a diode. Alternatively, the chip 210 may be a component such as a resistor, a protective device, a capacitor, a sensor or a detector, for example.

In one embodiment a component 210 has a gate contact pad or gate contact 215 and a source contact pad or source contact 216 on the first main surface 211. The component 210 further has a drain contact pad or a drain contact on the second main surface of the chip 212. Alternatively, the chip 210 may have other contact pad arrangements on its first and second main surfaces 211, 212. In one embodiment, the chip 210 may comprise all contact pads on the first main surface 211.

In one embodiment, the carrier 220 is a leadframe. The leadframe 220 may comprise leadframe contact pads or leads 225 and 226 and a die attach region 227. The leadframe contact pads 225, 226 are configured to be electrically connected to the component contact pads and a die attach region 227 is configured to receive the component 210. The leadframe 220 may comprise a conductive material such as a metal. For example, the leadframe 220 may comprise copper and/or nickel. In other embodiments, the carrier 220 is a substrate or a printed circuit board (PCB). The carrier 220 may comprise carrier contact pads 225, 226 and a component placement area 227.

The component 210 is attached to the carrier 220 at the component placement area 227. For example, the second main surface 212 of the component 210 is attached to the top surface of the carrier 220. The component 210 is attached with a die attach connection 230. For example, the second main surface 212 is bonded to the top surface of the carrier 220 using a eutectic bonding or an epoxy bonding. Alternatively, the second main surface 212 is bonded or glued to the top surface of the carrier 220 using an adhesive tape, a solder paste or a solder. Depending on the specific configuration the die attach connection 230 may be an electrical connection or may be an insulating barrier.

The gate contact pad 215 is electrically connected or bonded to the carrier contact pad 225 via a wire bond 252. The wire bond 252 may comprise copper (Cu), gold (Au) or aluminum (Al). The wire bond 252 may connect the gate contact pad 215 and/or carrier contact pad 225 via a ball bonding process or a wedge bonding process.

The source contact pad 216 is connected to the second carrier contact pad 226 with an electrical connection element 250. In one embodiment the electrical connection element 250 is not a wire bond. The electrical connection element 250 may comprise a conductive clip, a conductive bridge, a conductive tube, a conductive body or a conductive pipe. The electrical connection element 250 is configured to provide at the same time excellent electrical and thermal conductivity between the component 210 and the carrier 220. The electrical connection 250 may cool the component 210 much more efficiently than conventional electrical connections.

The electrical connection element 250 may be one of the embodiments of the electrical connection elements described with respect to FIGS. 1a-1e. The electrical connection element 250 comprises a core or hollow space. The hollow space may comprise or may be at least partially filled with a liquid. The liquid may be alcohol, water ($H_2O$), toluene, combinations thereof or other materials.

The electrical connection element 250 may comprise a metal. The metal may comprise copper or copper alloy, aluminum or aluminum alloy, nickel or nickel alloy, or iron or iron alloy. Alternatively, the electrical connection element 250 may comprise other materials. The electrical connection element 250 may be connected to the source contact pad 216 and the carrier contact pad 226 with a solder, a solder past, a conductive resin or a conductive tape 240.

The component 210 may be sealed or encapsulated with an encapsulation 260. The encapsulation 260 may be a molding compound, a laminate, or a casing.

The encapsulation 260 may partially encapsulate the carrier 220 and completely encapsulate the component 210. In one embodiment the encapsulation 260 may completely encapsulate the electrical connection 250 as shown in FIG. 2c. This embodiment has the advantage that it provides excellent protection against negative environmental influences. In one embodiment, the encapsulation 262 may not completely encapsulate the electrical connection 250 as shown in FIG. 2d. For example, the entire top surface or at least as substantial portion of the top surface may be exposed and not covered by the encapsulation 262. This embodiment has the advantage that it provides excellent cooling and heat dissipation of the component 210.

In one embodiment, the component 210 may be attached to a heat sink. The heat sink may be arranged between the component 210 and the carrier 220. In one embodiment the carrier 220 may comprise the heat sink. Packaging, encapsulation, electrical connection element and heat sinks provide a means for removing heat from the component 210 to the external environment. Generally, large current or power devices have large component and packaging surface areas and low thermal resistance. In one embodiment, the packed device 200 may not comprise a heat sink.

Figures 3A, 3B:
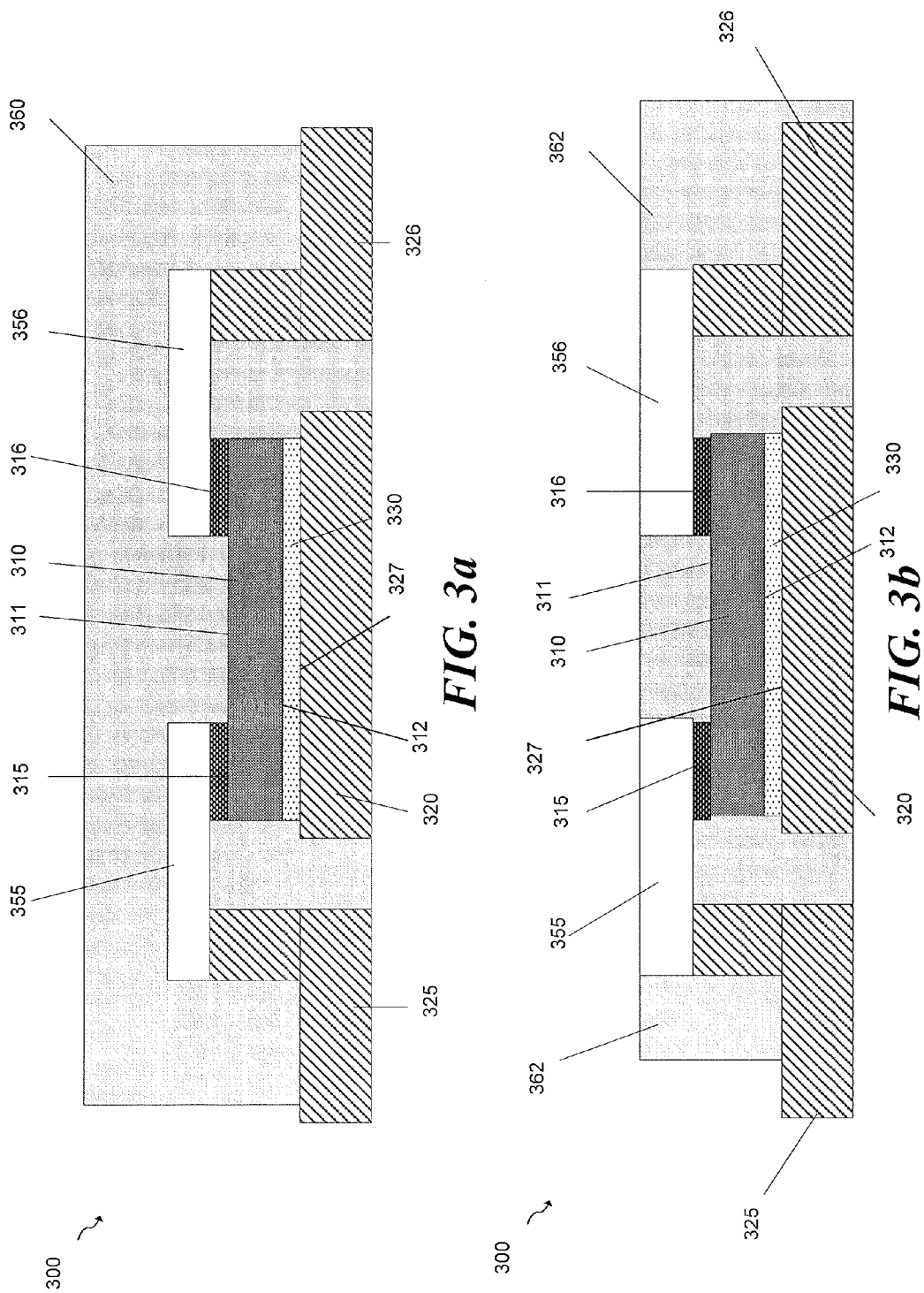
FIG. 3a-3b illustrate further embodiments of packaged electric devices.

FIGS. 3a-3a show embodiments of a packaged electric device 300. The packaged electric device 300 may be a packaged power or high power semiconductor device. The following discussion focuses on packaged semiconductor devices. However, embodiments of the invention may also apply to other packaged devices.

The packaged electric device 300 comprises a component 310. The component 310 may include a die or chip. The component 310 comprises a substrate. The substrate may be a semiconductor substrate such as silicon or germanium, or a compound substrate such as SiGe, GaAs, InP or SiC. The semiconductor substrate may be a single crystal silicon or a silicon-on insulator (SOI). One or more interconnect metallization layers may be arranged on the substrate. A passivation layer is disposed on the top surface of the chip to electrical isolate the structured metal pads from each other. The passivation layer may comprise SiN, for example. The top surface of the component 310 is the first main surface 311. The bottom of the substrate is the second main surface 312 of the component 310. The component 310 may be a system on chip (SoC).

The component 310 may comprise a discrete device such as a single semiconductor device or an integrated circuit (IC). For example, the component 310 may comprise a power semiconductor device such as a bipolar transistor, an insulated gate bipolar transistor (IGBT), a power MOSFET, a thyristor or a diode. Alternatively, the component 310 may be a resistor, a protective device, a capacitor, a sensor or a detector, for example.

In one embodiment the component 310 has a first contact pad or and a second contact pad on the first main surface 311. Optionally, the component 310 comprises a third contact pad on the first main surface 311. Alternatively, the third contact pad is arranged on the second main surface 312 opposite the first main surface 311.

In one embodiment, the carrier 320 is a carrier. The carrier 320 comprises first and second carrier contact pads 325, 326. The first and second carrier contact pads 325, 326 are configured to be electrically connected to the first and second component contact pads and component placement region 327 is configured to receive the component 310. The carrier 320 may comprise a conductive material such as a metal, a substrate or a printed circuit board (PCB).

The component 310 is attached to the carrier 320 at the component placement area 327. For example, the second main surface 312 of the component 310 is attached to the top surface of the carrier 320. In one embodiment the second main surface 312 is bonded to the top surface of the carrier 320 using an insulating bonding. The insulating bonding may be an epoxy or resin bonding or an adhesive tape. The die attach connection 330 may be an insulating barrier.

The first component contact pad 315 is electrically connected or bonded to the first carrier contact pad 325 via a first electrical connection element 355 and the second component contact pad 316 is electrically connected or bonded to the second carrier contact pad 326 via a second electrical connection element 356. The optional third component contact pad may be connected to the third carrier contact pad via a third electrical connection element. The first to third connection elements may be embodiments of the connection elements described with respect to FIGS. 1a-1e. Alternatively, the second contact element 356 and/or the third contact element may comprise a wire bond and the wire bond may be connected to the pads with a ball bonding process or a wedge bonding process. The electrical connection elements comprise a core or hollow space. The core or hollow space may comprise or liquid. The liquid may be alcohol, water ($H_2O$), toluene, combinations thereof or other materials.

The electrical connection elements may be the same or different. In one particular embodiment the first connection element 355 may be a copper or copper alloy heat pipe, the second connection element 356 may be a copper or copper alloy heat pipe and the third connection element may be a wire bond. Moreover, the first connection element 355 may be connected to a source chip contact pad, the second connection element may be connected to a drain chip contact pad and the wire bond may be connected to a gate chip contact pad.

The component 310 may be sealed or encapsulated with an encapsulation 360. The encapsulation 360 may comprise a molding compound, a laminate or a casing.

The encapsulation 360 may partially encapsulate the carrier 320 and completely encapsulate the component 310. In one embodiment the encapsulation 360 may completely encapsulate the electrical connection elements 355, 356 as shown in FIG. 3a. This embodiment has the advantage that it provides excellent protection against negative environmental influences. In one embodiment, the encapsulation 362 may not completely encapsulate the electrical connection elements 355, 356 as shown in FIG. 3b. For example, the entire top surface or at least as substantial portion of the top surface of the electrical connection elements 355, 356 may be exposed and not covered by the encapsulation 362. This embodiment has the advantage that it provides excellent cooling and heat dissipation of the component 310 (double side cooling).

In one embodiment, the component 310 may be attached to a heat sink. The heat sink may be arranged between the component 310 and the carrier 320. In one embodiment the carrier 320 may comprise the heat sink. Packaging, encapsulation, electrical connection element and heat sinks provide a means for removing heat from the component 310 to the external environment. Generally, large current or power devices have large component and packaging surface areas and low thermal resistance. In one embodiment the packed device 300 may not comprise a heat sink.

Figure 4:
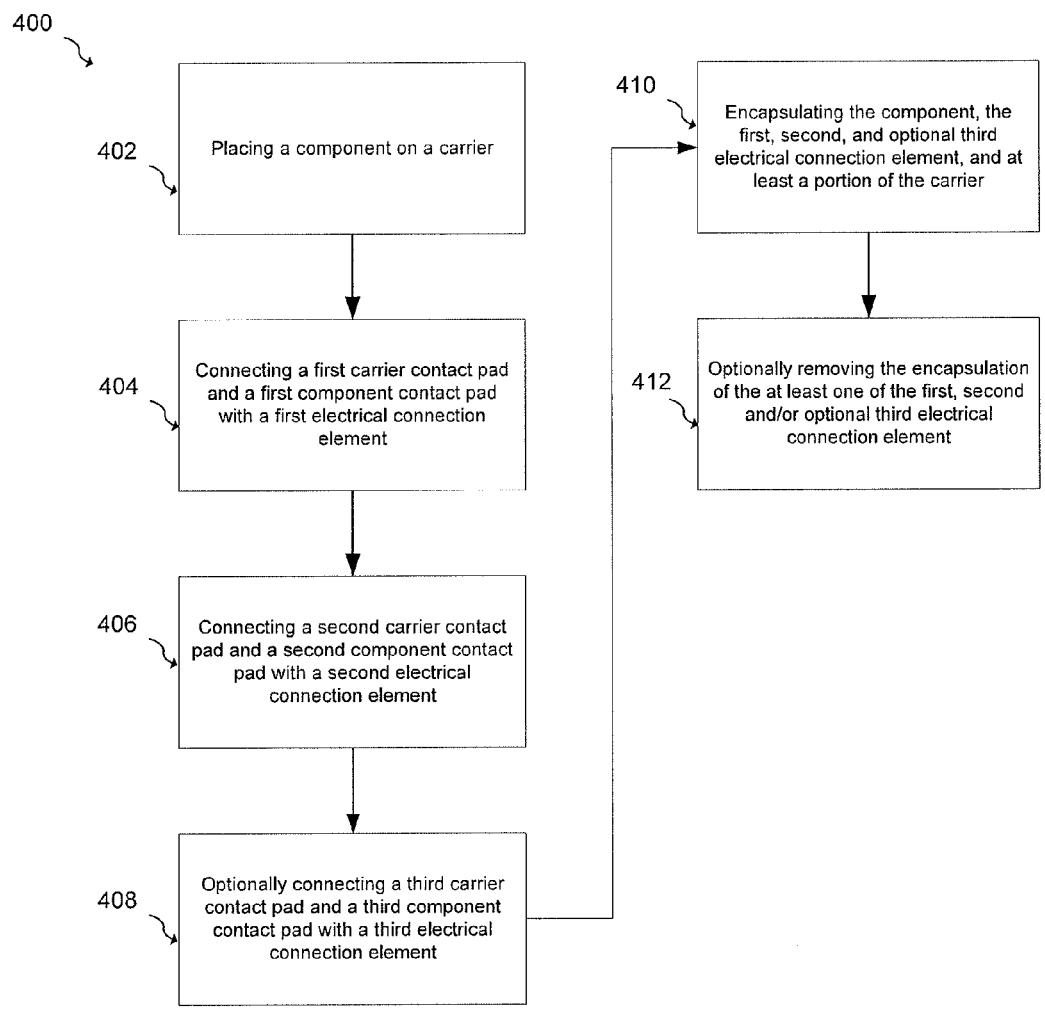
FIG. 4 shows a flowchart of an embodiment of a method of manufacturing a packaged electric device.

FIG. 4 shows a flowchart of an embodiment of a method for making a packaged electric device. In a first step 402, a component such as a chip is placed on a carrier. The component may be a discrete device or an integrated circuit (IC). The component may comprise component contact pads on a first main surface and/or on a second main surface. The component may be placed on a die attach area of the carrier. For example, the second main surface of the component is attached to a top surface of the carrier.

In a second step 404, a first component contact pad is connected with a first carrier contact pad. A first electrical connection element is connected to the first component contact pad and connected to the first carrier contact pad. The first electrical connection element comprises the same or similar materials, liquids and/or dimension as the electrical connection element described in the embodiments of FIGS. 1a-1e. The first electrical connection element is connected to the first component contact pad and the first carrier contact pad with a solder, solder paste or a conductive resin.

In the next step 406, a second component contact pad is connected with a second carrier contact pad. A second electrical connection element is connected to the second component contact pad and connected to the second carrier contact pad. The second electrical connection element comprises the same or similar materials, liquids and/or dimension as the electrical connection elements described in the embodiments of FIGS. 1a-1e. The second electrical connection element is connected to the second component contact pad and the second carrier contact pad with a solder, solder paste or a conductive resin. Alternatively, the second electrical connection element is a bond wire. The bond wire may comprise copper (Cu), gold (Au) or aluminum (Al). The bond wire may be connected to the second component contact pad and/or second carrier contact pad via a ball bonding process or a wedge bonding process.

In the optional step 408, a third component contact pad is connected with a third carrier contact pad. A third electrical connection element is connected to the third component contact pad and connected to the third carrier contact pad. The third electrical connection element comprises the same or similar materials, liquids and/or dimension as the electrical connection element described in the embodiments of FIGS. 1a-1e. The third electrical connection element is connected to the third component contact pad and the third carrier contact pad with a solder, solder paste or a conductive resin. Alternatively, the third electrical connection is a bond wire. The bond wire may comprise copper (Cu), gold (Au) or aluminum (Al). The bond wire may be connected to the third component contact pad and/or third carrier contact pad via a ball bonding process or a wedge bonding process.

At step 410 the electric device is encapsulated. The encapsulation material may be a molding compound, a laminate or a casing. The component, the first, second and optional third electrical connection elements may be completely encapsulated, and the carrier may be partially encapsulated. Alternatively, the component may be completely encapsulated and at least one of the first, second and optional third electrical connection elements may be partially encapsulated. In one embodiment the component and the second connection element are completely encapsulated, and the first electrical connection element and the carrier are partially encapsulated.

Finally at step 412, the encapsulation is optionally partially removed. In one embodiment, the encapsulation may be removed from at least one of the electrical connection elements. For example, the encapsulation may be removed from the first electrical connection, but not from the second and third electrical connection elements. Alternatively, the encapsulation may be removed from the first and second electrical connection elements but not form the third electrical connection element. The encapsulation may be removed by mechanical polishing or laser ablation.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electric device comprising:
    a carrier comprising a first carrier contact pad and a second carrier contact pad;
    a component disposed on the carrier, the component having a first component contact pad and a second component contact pad;
    a first electrical connection between the first component contact pad and the first carrier contact pad, wherein the first electrical connection comprises a first hollow space, and wherein the first hollow space comprises a first liquid; and a second electrical connection between the second component contact pad and the second carrier contact pad, wherein the second electrical connection comprises a second hollow space, and wherein the second hollow space comprises a second liquid.

2. The device according to claim 1, wherein at least one of the first liquid and the second liquid comprises alcohol, water, toluene or combinations thereof.

3. The device according to claim 1, wherein the first electrical connection and the second electrical connection comprises the same metal.

4. The device according to claim 1, further comprising an encapsulation encapsulating a portion of the carrier, a portion of the first electrical connection and the component.

5. The device according to claim 1, further comprising an encapsulation encapsulating a portion of the carrier, the first electrical connection and the component.

6. An electric device comprising:
a leadframe having a first lead and a second lead;
a chip disposed on the leadframe, wherein the chip comprises a bottom surface and a top surface and wherein a first chip contact pad and a second chip contact pad are disposed on the top surface; and
a first electrical connection electrically and thermally connecting the first chip contact pad and the first lead, wherein the first electrical connection encompasses a first liquid.

7. The device according to claim 6, further comprising a second electrical connection, wherein the second electrical connection connects the second chip contact pad and the second lead, wherein the second electrical connection encompasses a second liquid.

8. The device according to claim 7, wherein at least one of the first liquid and the second liquid comprises alcohol, water, toluene or combinations thereof.

9. The device according to claim 7, wherein the first electrical connection and the second electrical connection comprises a metal.

10. The device according to claim 7, wherein the first electrical connection and the second electrical connection comprise the same material, and wherein the first liquid and the second liquid comprise the same material.

11. The device according to claim 6, further comprising an encapsulation encapsulating a portion of the leadframe, a portion of the first electrical connection and the chip.

12. The device according to claim 6, further comprising an encapsulation encapsulating a portion of the leadframe, the first electrical connection and the chip.

13. A method of manufacturing an electric device, the method comprising:
placing a chip with a bottom surface on a carrier, the chip having a first and a second chip contact pads on a top surface;
connecting the first chip contact pad and a first carrier contact pad with a first electrical connection, the first electrical connection comprising a fluid in a first hollow space. and
connecting the second chip contact pad and a second carrier contact pad with a second electrical connection, wherein the second electrical connection comprises the fluid in a second hollow space.

14. The method according to claim 13, further comprising encapsulating at least a portion of the carrier, a portion of the first electrical connection, a portion of the second electrical connection and the chip.

15. The method according to claim 13, further comprising encapsulating at least a portion of the carrier, a portion of the first electrical connection, the second electrical connection and the chip.

16. The method according to claim 13, wherein the first and second electrical connections comprise copper (Cu).

17. An electric device comprising:
a carrier comprising a first carrier contact pad;
a component disposed on the carrier, the component having a first component contact pad;
a first electrical connection between the first component contact pad and the first carrier contact pad, wherein the first electrical connection comprises a first hollow space including a first liquid, wherein a first end of the first electrical connection is connected to the first component contact pad, and wherein a second end of the first electrical connection is connected to the first carrier contact pad; and
a second electrical connection between a second component contact pad of the component and a second carrier contact pad of the carrier, wherein the second electrical connection comprises a second hollow space including a second liquid, wherein a first end of the second electrical connection is connected to the second component contact pad, and wherein a second end of the second electrical connection is connected to the second carrier contact pad.

18. The device according to claim 17, further comprising an encapsulation body encapsulating the component and the first and second electrical connections such that surfaces of the first and second electrical connections form an outer surface of the encapsulation body.

19. The device according to claim 17, wherein the first electrical connection comprises a capillary structure.

20. The device according to claim 17, wherein the component is a power semiconductor device.

21. The device according to claim 17, wherein the first liquid comprises alcohol, water, or toluene.

22. The device according to claim 17, wherein the first hollow space comprises a first plurality of hollow spaces.

23. The device according to claim 17, wherein the first electrical connection comprises copper or aluminum.

24. An electric device comprising:
a carrier comprising a first carrier contact pad and a second carrier contact pad;
a component disposed on the carrier, the component having a first component contact pad and a second component contact pad;
a first electrical connection between the first component contact pad and the first carrier contact pad, wherein the first electrical connection comprises a first hollow space, and wherein the first hollow space comprises a first liquid;
a second electrical connection between the second component contact pad and the second carrier contact pad; and
an encapsulation encapsulating a portion of the carrier, a portion of the first electrical connection and the component.

25. An electric device comprising:
a carrier comprising a first carrier contact pad and a second carrier contact pad;
a component disposed on the carrier, the component having a first component contact pad and a second component contact pad;
a first electrical connection between the first component contact pad and the first carrier contact pad, wherein the first electrical connection comprises a first hollow space, and wherein the first hollow space comprises a first liquid;

a second electrical connection between the second component contact pad and the second carrier contact pad; and an encapsulation encapsulating a portion of the carrier, the first electrical connection and the component.

26. A method of manufacturing an electric device, the method comprising:

placing a chip with a bottom surface on a carrier, the chip having a first and a second chip contact pads on a top surface;

connecting the first chip contact pad and a first carrier contact pad with a first electrical connection, the first electrical connection comprising a fluid in a first hollow space;

connecting the second chip contact pad and a second carrier contact pad with a second electrical connection; and encapsulating at least a portion of the carrier, a portion of the first electrical connection, a portion of the second electrical connection and the chip.

27. A method of manufacturing an electric device, the method comprising:

placing a chip with a bottom surface on a carrier, the chip having a first and a second chip contact pads on a top surface;

connecting the first chip contact pad and a first carrier contact pad with a first electrical connection, the first electrical connection comprising a fluid in a first hollow space;

connecting the second chip contact pad and a second carrier contact pad with a second electrical connection; and encapsulating at least a portion of the carrier, a portion of the first electrical connection, the second electrical connection and the chip.

28. An electric device comprising:

a carrier comprising a first carrier contact pad;

a component disposed on the carrier, the component having a first component contact pad; and a first electrical connection between the first component contact pad and the first carrier contact pad, wherein the first electrical connection comprises a first hollow space including a first liquid, wherein a first end of the first electrical connection is connected to the first component contact pad, wherein a second end of the first electrical connection is connected to the first carrier contact pad, and wherein the first hollow space comprises a first plurality of hollow spaces.

* * * * *